(12) United States Patent
Lu et al.

(10) Patent No.: US 10,462,916 B2
(45) Date of Patent: Oct. 29, 2019

(54) BATTERY AND ELECTRONIC DEVICE COMPRISING SAID BATTERY

(71) Applicant: Feitian Technologies Co., Ltd., Beijing (CN)

(72) Inventors: Zhou Lu, Beijing (CN); Huazhang Yu, Beijing (CN)

(73) Assignee: Feitian Technologies Co., Ltd., Beijing (CN)

( * ) Notice: Subject to any disclaimer, the term of this patent is extended or adjusted under 35 U.S.C. 154(b) by 43 days.

(21) Appl. No.: 15/552,523

(22) PCT Filed: Mar. 10, 2016

(86) PCT No.: PCT/CN2016/076067
§ 371 (c)(1),
(2) Date: Aug. 22, 2017

(87) PCT Pub. No.: WO2016/150306
PCT Pub. Date: Sep. 29, 2016

(65) Prior Publication Data
US 2018/0054902 A1    Feb. 22, 2018

(30) Foreign Application Priority Data
Mar. 20, 2015   (CN) .......................... 2015 1 0122978

(51) Int. Cl.
*H01M 2/06*    (2006.01)
*H05K 5/00*    (2006.01)
(Continued)

(52) U.S. Cl.
CPC ............ *H05K 5/0086* (2013.01); *H01M 2/06* (2013.01); *H01M 2/065* (2013.01); *H01M 2/20* (2013.01);
(Continued)

(58) Field of Classification Search
CPC .......... H01M 2/06; H01M 2/065; H01M 2/20; H01M 2/30; H01M 4/661; H01M 4/663; H01M 10/425; H01M 10/4257
See application file for complete search history.

(56) References Cited

U.S. PATENT DOCUMENTS

2007/0222417 A1*   9/2007   Kim .................... H01M 10/425
                                                                    320/134
2009/0109099 A1*   4/2009   Jang .................... H01Q 1/2225
                                                                    343/702
(Continued)

*Primary Examiner* — Jimmy Vo
(74) *Attorney, Agent, or Firm* — Hammer & Associates, P.C.

(57) ABSTRACT

A battery, in which an electrolyte (103) is positioned between a first electrode material (102) and a second electrode material (104), the first electrode material (102) is positioned between the first electrode current collector (101) and the electrolyte (103), the second electrode material (104) is positioned between a second electrode current collector (105) and the electrolyte (103), the second electrode current collector (105) is positioned between the second electrode material (104) and a PCB substrate (107), and the PCB substrate (107) is positioned between the second electrode current collector (105) and a PCB surface layer (108). By using one of the electrode current collectors in the battery as one layer of a printed circuit board, limitations on the size of the battery can be reduced without increasing the size of the electronic device in which the battery is situated, thus increasing the battery capacity.

12 Claims, 2 Drawing Sheets

(51) Int. Cl.
  *H01M 2/20* (2006.01)
  *H01M 2/30* (2006.01)
  *H01M 4/66* (2006.01)
  *H01M 10/42* (2006.01)
  *H05K 1/18* (2006.01)

(52) U.S. Cl.
  CPC ............ *H01M 2/30* (2013.01); *H01M 4/661* (2013.01); *H01M 4/663* (2013.01); *H01M 10/425* (2013.01); *H01M 10/4257* (2013.01); *H05K 1/18* (2013.01); *H05K 5/0017* (2013.01)

(56) References Cited

U.S. PATENT DOCUMENTS

2011/0104520 A1* 5/2011 Ahn ..................... H01M 2/22
  429/7
2015/0017522 A1  1/2015 Miyatake et al.

* cited by examiner

US 10,462,916 B2

BATTERY AND ELECTRONIC DEVICE COMPRISING SAID BATTERY

FIELD OF THE INVENTION

The present invention relates to a battery and an electronic device containing the battery, which belongs to electronic technology field.

PRIOR ART

With development of the electronic technology, there are more and more kinds of electronic devices, which are widely used in people's daily life. Considering portability, the volume of the electronic device becomes smaller and smaller and the volume of the battery in the electronic device becomes smaller correspondingly, which limits the battery power. The battery is charged frequently or needs to be replaced often in a process of using the electronic device, which causes unpleasant influence on the user experience of the electronic device.

SUMMARY OF THE INVENTION

One object of the present invention is to provide a battery, of which the volume is not limited and the battery power is increased.

Another object of the present invention is to provide an electronic device which uses the battery of the present invention, which does not require charging battery frequently or replacing battery often during using of the electronic device.

According to one aspect of the present invention, a battery is provided, which comprises a first electrode current collector, a first electrode material, an electrolyte, a second electrode material, a second electrode current collector, a PCB substrate, a PCB surface layer, a first electrode lead and a second electrode lead, wherein the electrolyte is located between the first electrode material and the second electrode material, the first electrode material is located between the first electrode current collector and the electrolyte, the second electrode material is located between the second electrode current collector and the electrolyte, the second electrode current collector is located between the second electrode material and the PCB substrate, the PCB substrate is located between the second electrode current collector and the PCB surface layer, the second electrode current collector, the first electrode lead and the second electrode lead are located in the same plane, the second electrode lead and the second electrode current collector are conducted, the first electrode lead and the first electrode current collector are conducted, and the first electrode lead and the first electrode current collector are insulated to the second electrode current collector and the second electrode lead.

Preferably, the battery further comprises an insulating tape, the insulating tape, the second electrode current collector, the first electrode lead and the second electrode lead are in the same plane, and the insulated tape isolates the first electrode lead from the second electrode current collector and the second electrode lead.

Preferably, the first electrode current collector comprises a jointing part and a protruding portion, the jointing portion joints the first electrode material, the protruding portion abuts the first electrode lead.

Preferably, the second electrode current collector and the PCB surface layer is copper foil.

Preferably, the battery further comprises an insulating layer, the first electrode collector is located between the insulating layer and the first electrode material, the insulating layer seals the edge of the battery.

Preferably, the battery further comprises a connecting part, the connecting part is located at the edge of the battery, the connecting part connects to the first electrode lead and the second electrode lead respectively.

Preferably, one or a plurality of pads are arranged on the PCB surface layer, the connecting part connects with the pad by printed wiring.

Preferably, the second electrode current collector comprises a center part and an edge part, wherein the center part joints the second electrode material, at least one via hole is arranged on a position, which is corresponding to the edge part, of the PCB surface layer.

According to another aspect of the present invention, an electronic device containing the battery of is provided, the electronic device further comprises a main board, one or a plurality of electronic components are arranged on the main board, the first electrode lead and the second electrode lead of the battery connect to at least one electronic component on the main board by the connecting part at the edge of the battery, the battery supplies power to the electronic component.

Preferably, the electronic device further comprises a digit display, the main board connects to the digit display by the connecting part, the battery supplies power to the digit display.

According to the present invention, one of the electrode current collectors is multiplexed as one surface layer of a printed circuit board, which reduces limitation of volume of a battery and increases battery power without enlarging volume of a electronic device containing the battery.

BRIEF DESCRIPTION OF THE ACCOMPANYING DRAWINGS

DETAILED DESCRIPTION OF THE PRESENT INVENTION

The embodiments of the disclosure are described clearly and completely in conjunction with the accompanying drawings as follows. Apparently, the described embodiments are merely a part of but not all of the embodiments according to the disclosure. Based on the described embodiments of the disclosure, other embodiments obtained by those skilled in the art without any creative work belong to the scope of protection of the present invention.

Figure 1:
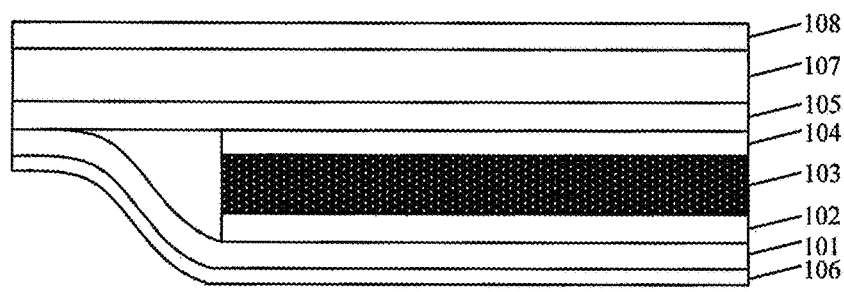
FIG. 1 is a section view of a battery of an embodiment of the present invention.

According to one embodiment of the present invention, a battery is provided. As shown in FIG. 1, the battery includes a first electrode current collector 101, a first electrode material 102, an electrolyte 103, a second electrode material 104, a second electrode current collector 105, an insulating layer 106, a PCB (Printed Circuit Board) substrate 107, a PCB surface layer 108, the electrolyte 103 is located between the first electrode material 102 and the second electrode material 104, the first electrode material 102 is located between the first electrode current collector 101 and the electrolyte 103, the second electrode material 104 is located between the second electrode current collector 105 and the electrolyte 103, the first electrode current collector 101 is located between the insulating layer 106 and the first electrode material 102, the second electrode current collector 105 is located between the second electrode material 104 and the PCB substrate 107, the PCB substrate 107 is located between the second electrode current collector 105 and the PCB surface layer 108.

In this case, the second electrode current collector 105 and the PCB surface layer 108 is copper foil, the insulating layer 106 seals edge of the battery, the second electrode current collector 105, PCB substrate 107 and PCB surface layer 108 made up of PCB structure, the PCB structure can be flexible PCB, dual-sided PCB or multi-layer PCB. When the first electrode material 102 is cathode material, the second electrode material 104 is anode material, the first electrode current collector 101 is cathode current collector, the second electrode current collector 105 is anode current collector; when the first electrode material 102 is anode material, the second electrode material 104 is cathode material, the first electrode current collector 101 is anode current collector, the second electrode current collector 105 is cathode current collector.

Figure 2:
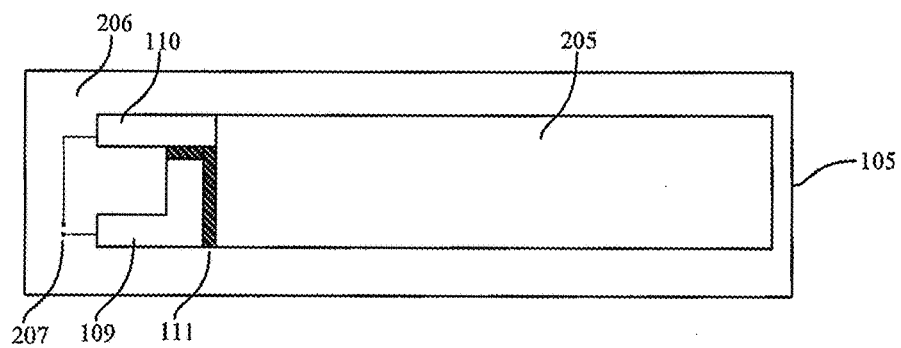
FIG. 2 is a structural schematic view of a second electrode current collector of an embodiment of the present invention.

Further, as shown in FIG. 2, the battery in the present embodiment of the present invention further includes a first electrode lead 109 and a second electrode lead 110, the second electrode current collector 105, the first electrode lead 109 and the second electrode lead 110 are located in the same plane, the second electrode lead 110 and the second electrode current collector 105 are conducted, the first electrode lead 109 and the first electrode current collector 101 are conducted, the first electrode lead 109 and the first electrode current collector 101 are insulated to the second electrode current collector 105 and the second electrode lead 110. In this case, when the first electrode current collector 101 is cathode current collector, the first electrode lead 109 is positive wire, the second electrode lead 110 is negative wire; when the first electrode current collector 101 is anode current collector, the first electrode lead 109 is negative wire, the second electrode lead 110 is positive wire.

Specifically, the battery in the present embodiment of the present invention further includes an insulating tape 111, the insulating tape 111, the second electrode current collector 105, the first electrode lead 109 and the first electrode lead 110 are in the same plane, and the insulated tape 111 isolates the first electrode lead 109 from the second electrode current collector 105 and the second electrode lead 110.

Figure 3:
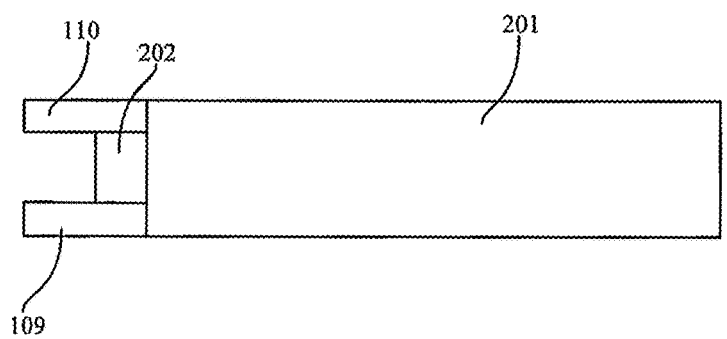
FIG. 3 is a structural schematic view of a first electrode current collector of an embodiment of the present invention.

Correspondingly, as shown in FIG. 3, the first electrode current collector 101 comprises a abutting part 201 and a protruding portion 202, the abutting part 201 abuts the first electrode material 102, the protruding portion 202 abuts the first electrode lead 109.

In addition, in FIG. 2, the second electrode current collector 105 comprises a center part 205 and an edge part 206, wherein the center part 205 abuts the second electrode material 104, at least two via holes 207 (through hole) are arranged on the edge part 206. The first electrode lead 109 and the second electrode lead 110 connect to the connecting part 203 on the PCB surface layer 108 through different via holes 207, respectively, as shown in FIG. 4.

Figure 4:
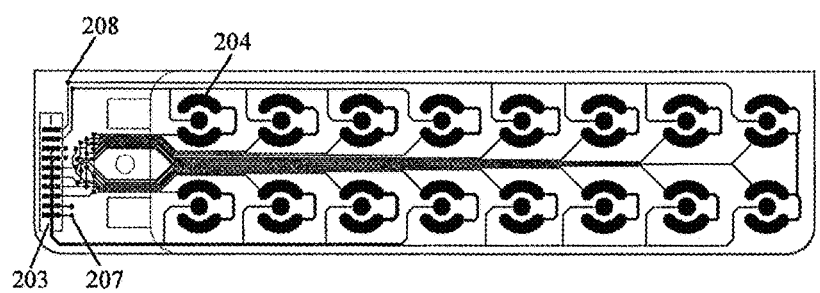
FIG. 4 is a structural schematic view of PCB surface layer of an embodiment of the present invention.

Further, the battery of the present invention further includes a connecting part 203 located at the edge of the battery; as shown in FIG. 4, the connecting part 203, which is located on the PCB surface layer 108, connects to the first electrode lead 109 and the second electrode lead 110 respectively through the via holes 207 (through hole) of the edge part 206 as shown in FIG. 2. In the embodiment of the present invention, the connecting part 203 can be edge-board contact, which is called gold finger as well, or any other connecting part.

In addition, one or more pads 204 are arranged on the PCB surface layer 108, the pad 204 is welded with electronic components, such as press key, resistor, capacitor and metal dome, etc. The connecting part 203 connects with the pad 204 by printed wiring, at least one via hole 208 (through hole) is arranged on position, which is corresponding to the edge part 206 in the second electrode current collector 105 as shown in FIG. 2, of the PCB surface layer 108, the printing wiring connected to the pad 204 connects to the connecting part 203 or electronic parts of other layers through the via hole 208.

Figure 5:
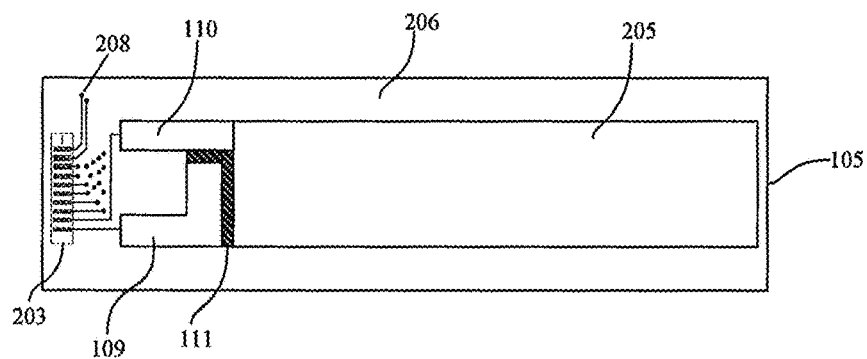
FIG. 5 is another structural schematic view of the second electrode current collector of an embodiment of the present invention.

It should be noted that, the connecting part 203 can be arranged in the edge part 206 of the second electrode current collector 105; as shown in FIG. 5, the first electrode lead 109 and the second electrode lead 110 connect to the connecting part 203, respectively.

Figure 6:
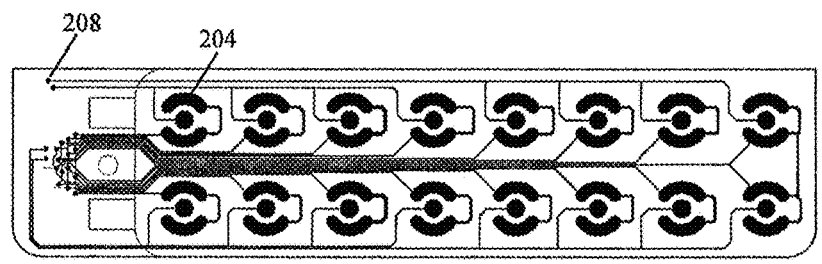
FIG. 6 is another structural schematic view of PCB surface layer of an embodiment of the present invention.

Correspondingly, the structure of the PCB surface layer 108 is shown in FIG. 6, at least one via hole 208 is arranged on position, which is corresponding to the edge part 206 in the second electrode current collector 105 shown in FIG. 5, of the PCB surface layer. The pad 204 connects to the connecting part 203 through the via hole 208.

According to the embodiment of the present invention, one of the electrode current collector in the battery is multiplexed as one surface layer of a printed circuit board, which reduces limitation of volume of a battery, increases battery power and makes the battery to be flexible without enlarging volume of a electronic device containing the battery.

Figure 7:
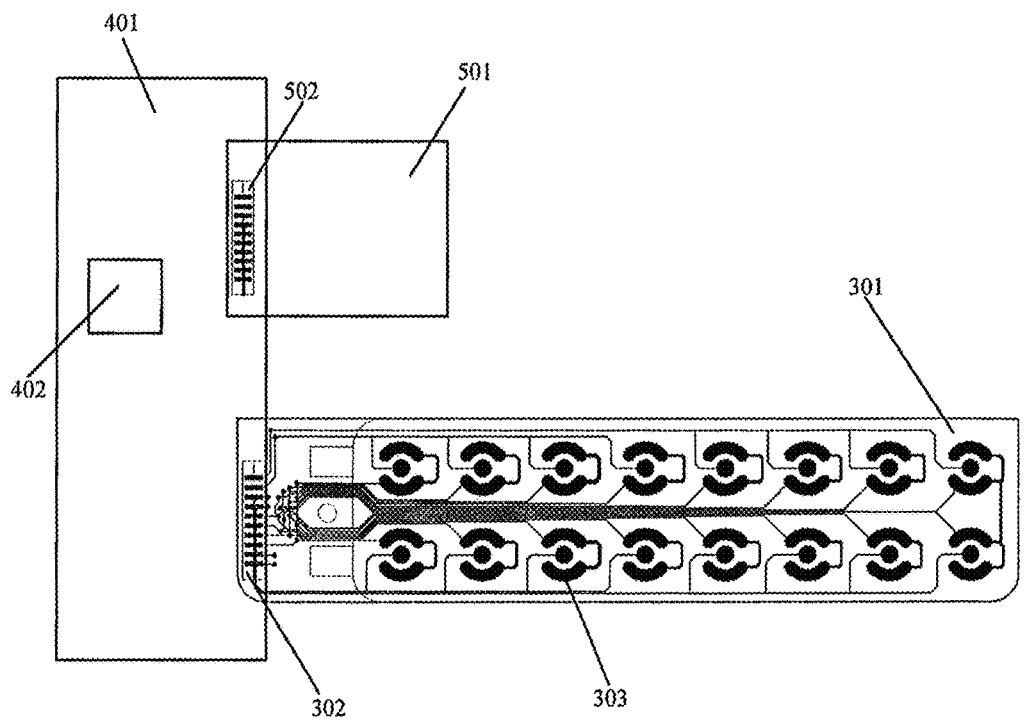
FIG. 7 is a structural schematic view of an electronic device of an embodiment of the present invention.

Based on the battery above, the embodiment of the present invention further provides an electronic device containing the battery. As shown in FIG. 7, the electronic device comprises the battery 301 and a main board 401, one or a plurality of electronic components 402 are arranged on the main board 401, the first electrode lead and the second electrode lead of the battery 301 are connected to at least one electronic component 402 on the main board 401 by the connecting part 302 at the edge of the battery 301, the battery 301 supplies power to the electronic component 402. In this case, the PCB surface lay of the battery 301 can be welded with electronic components, for example, touch key, resistor, capacitor and metal dome, etc., by the pad 303; the electronic components 402 arranged on the main board 401 can be one or combination of touch key, resistor, capacitor, metal dome and micro-processor.

Further, the electronic device above further includes a digit display 501, the main board 401 connects to the digit display 501 by means of the connecting part 502, and the battery 301 supplies power to the digit display 501.

In addition, the electronic component of the PCB surface layer of the battery 301 can connect to the electronic component 402 on the main board and/or digit display.

According to the embodiment of the present invention, one of the electrode current collectors in the battery is multiplexed as one surface layer of a printed circuit board, which reduces limitation of volume of a battery, increases battery power, reduces the whole thickness of the electronic device and makes the whole electronic device to be flexible without enlarging volume of a electronic device containing the battery.

The described embodiments are only preferred embodiments of the application and the embodiments are not intended to limit the application. Any alteration or change easily obtained by those skilled in the art based on the application should fall in the scope of protection of the application. The claims of the present invention limit the scope of protection of the present invention.

The invention claimed is:

1. A battery comprises:
    a first electrode current collector (101),
    a first electrode material (102),
    an electrolyte (103),
    a second electrode material (104),
    a printed circuit board (PCB) structure made of a second electrode current collector (105), a PCB substrate (107), and a PCB surface layer (108),
    a first electrode lead (109), and
    a second electrode lead (110),
    one of the first electrode current collector (101) and the second electrode current collector (105) is multiplexed as one surface layer of a printed circuit board;
    the electrolyte (103) is located between the first electrode material (102) and the second electrode material (104), the first electrode material (102) is located between the first electrode current collector (101) and the electrolyte (103), the second electrode material (104) is located between the second electrode current collector (105) and the electrolyte (103), the second electrode current collector (105) is located between the second electrode material (104) and the PCB substrate (107), the PCB substrate (107) is located between the second electrode current collector (105) and the PCB surface layer (108),
    the second electrode current collector (105), the first electrode lead (109) and the second electrode lead (110) are located in the same plane; the second electrode lead (110) and the second electrode current collector (105) are conducted, the first electrode lead (109) and the first electrode current collector (101) are conducted, and the first electrode lead (109) and the first electrode current collector (101) are insulated to the second electrode current collector (105) and the second electrode lead (110).

2. The battery of claim 1, wherein the battery further comprises an insulating tape, the insulating tape, the second electrode current collector, the first electrode lead and the second electrode lead are in the same plane, and the insulated tape isolates the first electrode lead from the second electrode current collector and the second electrode lead.

3. The battery of claim 1, wherein the first electrode current collector comprises an abutting part and a protruding portion, the abutting part abuts with the first electrode material, the protruding portion abuts with the first electrode lead.

4. The battery of claim 1, wherein the second electrode current collector and the PCB surface layer are both copper foil.

5. The battery of claim 1, wherein the battery further comprises an insulating layer, the first electrode collector is located between the insulating layer and the first electrode material, and the insulating layer seals the edge of the battery.

6. The battery of claim 1, wherein the battery further comprises a connecting part, the connecting part is located at the edge of the battery, and the connecting part connects to the first electrode lead and the second electrode lead, respectively.

7. The battery of claim 6, wherein the connecting part connects with the pad by a printed wiring.

8. The battery of claim 1, wherein the second electrode current collector comprises a center part and an edge part, the center part joints the second electrode material, and at least one hole is arranged on position, which corresponds to the edge part, of the PCB surface layer.

9. An electronic device containing the battery of claim 1, wherein the electronic device further comprises a main board, one or a plurality of electronic components are arranged on the main board, the first electrode lead and the second electrode lead of the battery connect to at least one electronic component on the main board by means of the connecting part at the edge of the battery, and the battery supplies power to the electronic component.

10. The electronic device of claim 9, wherein the electronic device further comprises a digit display, the main board connects with the digit display by the connecting part, and the battery supplies power to the digit display.

11. The battery of claim 1, wherein one or more pads are arranged on the PCB surface layer, the pad is welded with electronic components.

12. The battery of claim 1, wherein the PCB structure is flexible PCB, dual-sided PCB or multi-layer PCB.

* * * * *